United States Patent [19]
Shinohara et al.

[11] Patent Number: 5,448,173
[45] Date of Patent: Sep. 5, 1995

[54] TRIPLE-PROBE PLASMA MEASURING APPARATUS FOR CORRECTING SPACE POTENTIAL ERRORS

[75] Inventors: Kibatsu Shinohara; Tsuku Umezawa, both of Yokohama, Japan

[73] Assignees: Nihon Kosyuha Kabushiki Kaisha, Kanagawa; Nichimen Kabushiki Kaisha, Osaka, both of Japan

[21] Appl. No.: 967,014

[22] Filed: Oct. 27, 1992

[30] Foreign Application Priority Data

Oct. 31, 1991 [JP] Japan ................. 3-313572

[51] Int. Cl.⁶ .............. G01N 27/62; G01R 29/00; G01K 13/00
[52] U.S. Cl. ........................ 324/464; 324/71.1; 324/72; 324/444; 324/459; 324/715; 324/720; 374/142
[58] Field of Search .......... 324/71.1, 444, 459, 324/464, 700, 713, 715–718, 720, 724, 72, 72.5; 73/23.21; 374/141, 142

[56] References Cited

U.S. PATENT DOCUMENTS

| | | | |
|---|---|---|---|
| 2,211,124 | 8/1940 | Jakosky | 324/357 X |
| 3,731,187 | 5/1973 | Hausler et al. | 324/700 X |
| 3,867,687 | 2/1975 | Gealt | 324/444 |
| 4,242,188 | 12/1980 | Niinomi et al. | |
| 4,435,681 | 3/1984 | Masuda et al. | 324/464 X |
| 4,823,087 | 4/1989 | Sugimori | 324/720 X |
| 5,031,125 | 7/1991 | Shimizu et al. | |
| 5,198,774 | 3/1993 | Williams, II et al. | 324/464 X |

OTHER PUBLICATIONS

N. Tsutsui, "Basic Plasma Engineering", pp. 167–183, Uchida-Rokakuho Co. May 30, 1986.

Primary Examiner—Gerard R. Strecker
Attorney, Agent, or Firm—Finnegan, Henderson, Farabow, Garrett & Dunner

[57] ABSTRACT

With a view to enabling errors in the space potential to be automatically corrected by detecting a floating potential in each of a plurality of probes and to remove the errors in measurement based on the corrected space potential to thereby realize the accurate measurement of the space potential, there is provided a triple-probe plasma measuring apparatus, which comprises: a circuit for measuring electron temperature and electron density of a plasma with use of triple probes; a circuit for detecting and holding a floating potential difference; a differential voltage adding circuit; a fixed voltage source; and a change-over switch, the apparatus being capable of determining a difference in the floating potentials at the position of said probes, and superimposing the potential difference determined on the fixed voltage.

5 Claims, 5 Drawing Sheets

PROBE

Te
TO MEASURING
CIRCUIT

Ne
TO MEASURING
CIRCUIT

TRIPLE-PROBE PLASMA MEASURING APPARATUS FOR CORRECTING SPACE POTENTIAL ERRORS

BACKGROUND OF THE INVENTION a) Field of the Invention

This invention relates to a triple-probe plasma measuring apparatus for industrial application of various plasma-application devices for accurately measuring or monitoring electron temperature and electron density of plasma.

b) Description of Related Art

In case of the application of plasma technique, it is necessary to instantaneously diagnose various quantities in plasma, particularly electron temperature and electron density. The so-called "triple-probe method" as a method for plasma diagnosis and a plasma measuring apparatus using this method is considered to be the most effective one, because it is capable of indicating at once these variables on indicating instruments.

This diagnostic method is effected by placing three probes, all having an equal area, in a juxtaposed relationship, at a location which is considered to be at an equi-potential level within the plasma, and by applying different voltages to these probes.

The triple-probe method has a ground of its establishment on the assumption that plasma is uniformly distributed in space, and that space potentials are respectively equal at positions where these three probes are present. In reality, however, it is almost rare that the space potentials are equal at those positions where the three probes are located. Rather, due to a slight potential difference existing between the adjacent probes, an error in the measured values was inevitable.

SUMMARY OF THE INVENTION

It is therefore an object of the present invention to provide a triple-probe plasma measuring apparatus for correcting errors in the space potential.

According to the present invention, in its general aspect, there is provided a triple-probe plasma measuring apparatus, which comprises: a circuit for measuring electron temperature and electron density of a plasma with use of triple probes; a circuit for detecting and holding a floating potential difference; a differential voltage adding circuit; a fixed voltage source; and a change-over switch, the apparatus being capable of determining a difference in the floating potentials at the position of the probes, and superimposing the potential difference as found on the fixed voltage to thereby enable the floating potential to be automatically corrected.

The foregoing object, other objects as well as specific construction and function of the triple-probe plasma measuring apparatus according to the present invention will become more apparent and understandable from the following description of preferred embodiments thereof, when read in conjunction with the accompanying drawing.

BRIEF DESCRIPTION OF ACCOMPANYING DRAWING

DETAILED DESCRIPTION OF PREFERRED EMBODIMENTS

The preferred embodiments of the present invention automatically correct a difference in the space potentials by detecting a floating potential in each of these probes; and remove the errors in measurement based on the corrected space potential, thereby realizing accurate measurement of the space potential.

Figure 3:
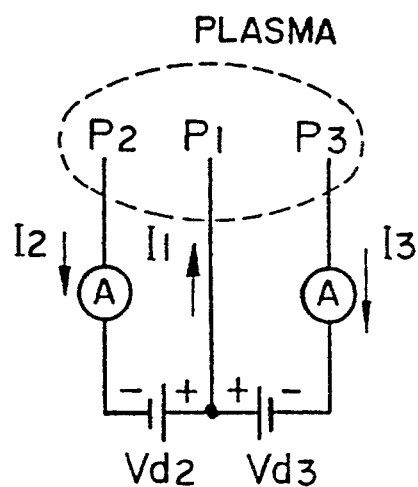
FIG. 3 is an explanatory diagram for a relationship between voltage and current to be imparted to the three probes.
Figure 4:
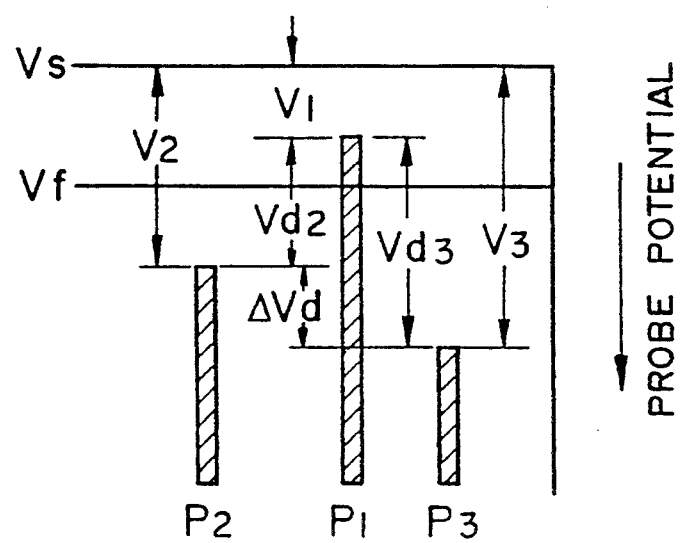
FIG. 4 is an explanatory diagram for an electric potential in each probe with respect to a reference voltage Vs.
Figure 5:
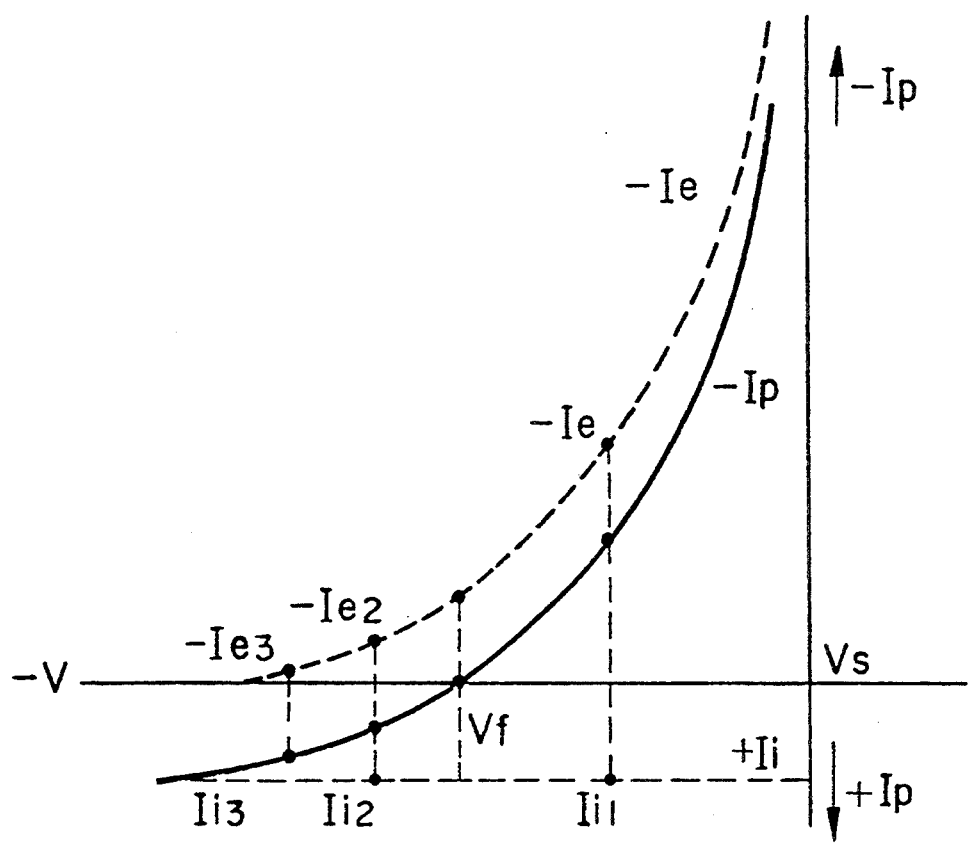
FIG. 5 is a graphical representation showing a relationship among probe potential, electron current Ie, and ion current Ii.

According to the triple-probe method, as shown in FIG. 3, three probes $P_1$, $P_2$, and $P_3$, all having an equal area, are inserted in a mutually adjacent relationship into a position of a plasma where a space potential is Vs, followed by application of voltages $V_{d2}$ and $V_{d3}$ and by reading of the electric current $I_2$ and $I_3$, whereupon the electric potential in each probe will be across from each other at a floating potential Vf as shown in FIG. 4, and all of those potentials will take negative values with the space potential Vs being as a reference. Since the probe $P_1$ is on the positive side with reference to the floating potential Vf, it captures an electron current $Ie = I_1$, while the probes $P_2$ and $P_3$, which are on the negative side, capture an ion current $Ii = I_2 + I_3$. In this case, since the probe system is potentially floating, the floating potential Vf will lag so as to satisfy a relationship of $I_1 = I_2 + I_3$. FIG. 5 shows variations in the electron current and the ion current with respect to variations in the probe potential. As for the triple-probe method, detailed explanations are given in, for example, a technical reference book, titled "Basic Plasma Engineering" by N. Tsutsui, published from Uchida-Rokakuho Publishing Co., Japan (pp. 167 to 183). In particular, the principle of its measurement is explained at pages 168 to 175, wherein it is described that the electron temperature Te and the electron density Ne can be directly indicated on the indicating instruments.

Figure 6:
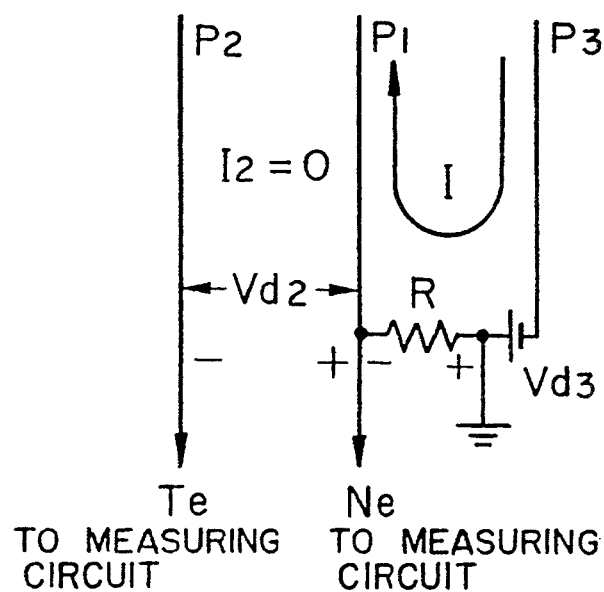
FIG. 6 is an explanatory diagram for the principle of the triple-probe method.

Now, as shown in FIG. 6, if and when a volt-meter having a high input impedance is connected to the probe $P_2$ to render it in a potentially floating condition, the current $I_2$ becomes zero, hence $I_1 = I_3$. As the consequence of this, the electron temperature Te can be obtained from the value of the output voltage $V_{d2}$ of the probe $P_2$, and the electron density Ne can be obtained from the value of the current $I = I_1 = I_3$ to be measured as a terminal voltage of a low impedance resistor R and the electron temperature Te. Then, by amplifying these voltages through the electron temperature (Te) measuring circuit and the electron density (Ne) measuring circuit, these values can be indicated on an indicating instrument with direct reading graduations.

Figure 1:
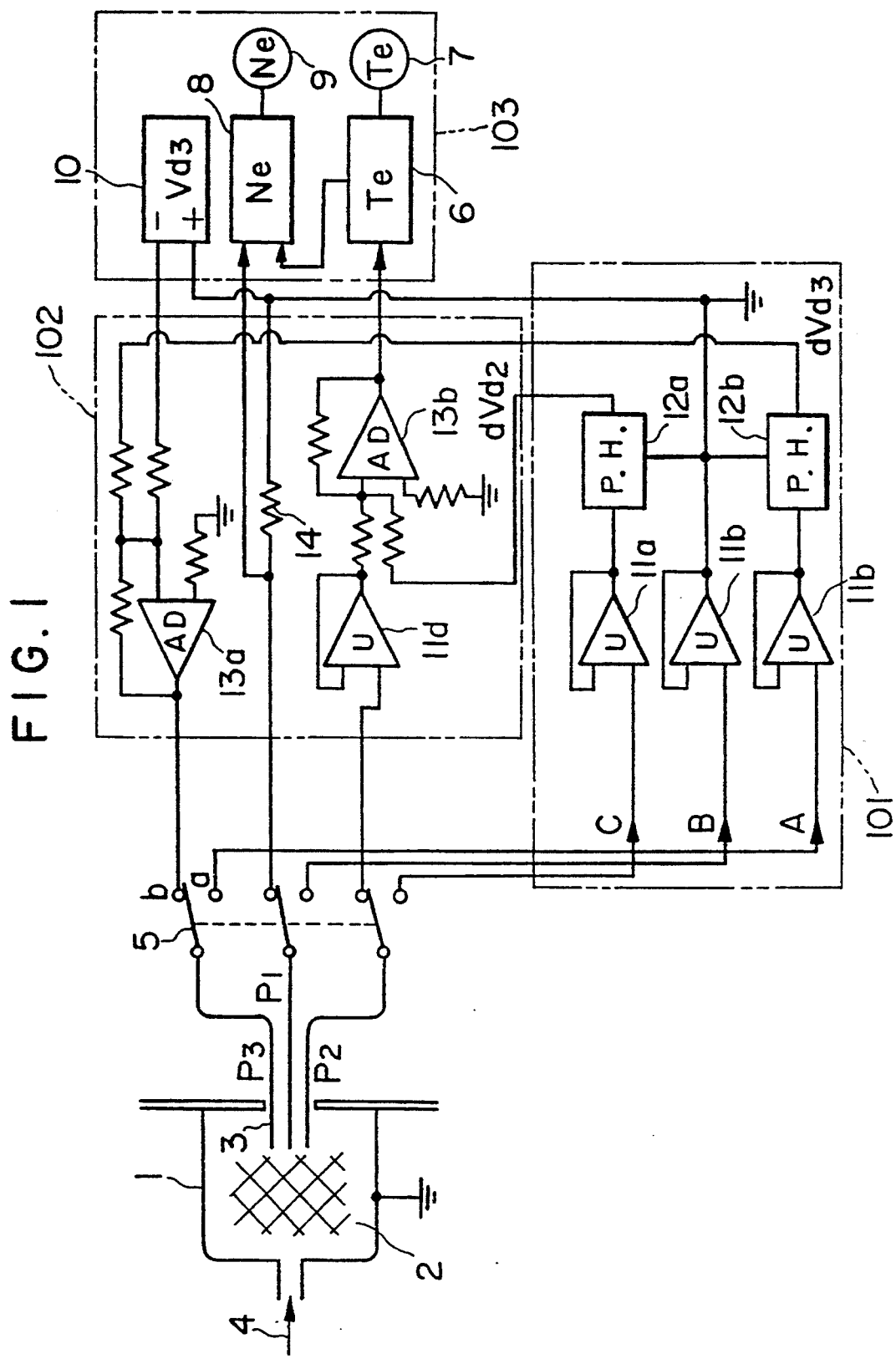
FIG. 1 is a system diagram showing one embodiment of the triple-probe plasma measuring apparatus according to the present invention.

The abovementioned operating principle of the circuit shown in FIG. 6 is further materialised by the circuit in FIG. 1, wherein the response speed can be improved by reducing the load impedance at the probe $P_2$ to avoid the real-effect of floating capacitance.

In this case, the voltage drop, in the resistors, of the currents $I_1$, $I_2$, and $I_3$ of the respective probes $P_1$, $P_2$, and $P_3$ is introduced into the measuring circuit to modify the equations 3.46 and 3.47 appearing at page 170 of the abovementioned technical literature, as follows:

$$(I_1+I_2)/(I_1+I_3)=[1-exp(-eV_{d2}kTe)]/[1-exp(-eV_{d3}/kTe)]$$

$$Ii=[I_3-I_2\,exp(-e\Delta V_d/kTe)]/[1-exp(-e\Delta V_d/kTe)]$$

As shown in FIG. 4, $V_{d2}=V_2-V_1$, $V_{d3}=V_3-V_1$, $\Delta V_d = V_{d3} - V_{d2}$, and Ii represents an ion-saturated current. Accordingly, when a fixed voltage such as $V_{d2}=2V$, $V_{d3}=10V$, etc. is applied to the probes, and the values of $I_1$, $I_2$ and $I_3$ are measured instantaneously, the electron temperature Te can be found also, the electron density Ne can be obtained from the saturated current Ii. The relationship between this ion-saturated current Ii and the electron density Ne is shown by the equation 1.52 at page 27 of the abovementioned technical literature. In these various equations, "e" designates electron charge, and "k" represents the Boltzmann's constant.

In the above-described triple-probe method, three probes are adjacently disposed within a uniform plasma, and the calculation is done on the assumption that the space potentials of these probes are equal. If, however, the values are different, errors in the measurement would occur. The present invention makes such measurement after the potential difference has been corrected.

Figure 7:
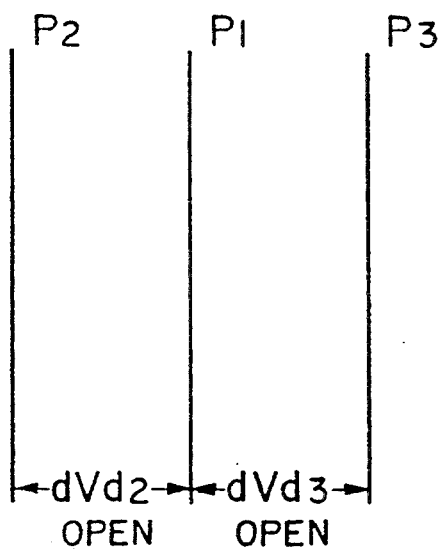
FIG. 7 is an explanatory diagram for a potential difference among the probes when a load onto the probe is removed.

In more detail, according to the present invention, as shown in FIG. 7, the loads on these three probes are removed to measure a potential difference $dV_{d2}$ between a basic probe $P_1$ and probe $P_2$, and a potential difference $dV_{d3}$ between the probe $P_1$ and probe $P_3$, the values of which are stored or memorized. Then, when various plasma quantities are measured, corrected voltages obtained by subtracting these quantities from corresponding measured values are applied to the respective measuring circuits to determine the electron temperature and the electron density. In this manner, a difference in the space potential between the adjacent probes can be corrected.

As shown in FIG. 1, a preferred embodiment of the present invention, includes a single fixed constant voltage power source 10, a change-over switch 5 between three probes and the measuring circuit 103, a holding circuit 101 for detecting a floating potential difference, and an addition circuit 102. First, the load on each probe is disconnected from the addition circuit 102 by the switch, and the space potential differences $dV_{d2}$ and $dV_{d3}$ between the adjacent probes is determined by the holding circuit 101, the values as obtained being stored.

Next, the switch is changed over to add the corrected voltage $dV_{d3}$ of the probe $P_3$ to the fixed voltage power source $V_{d3}$ by the addition circuit 102, followed by imparting it to the probe $P_3$, while the corrected voltage $dV_{d2}$ is added to the output voltage of the probe $P_2$, to thereby produce on the indicating instrument the electron temperature Te and the electron density Ne, as the outputs, by the measuring circuit.

Figure 2:
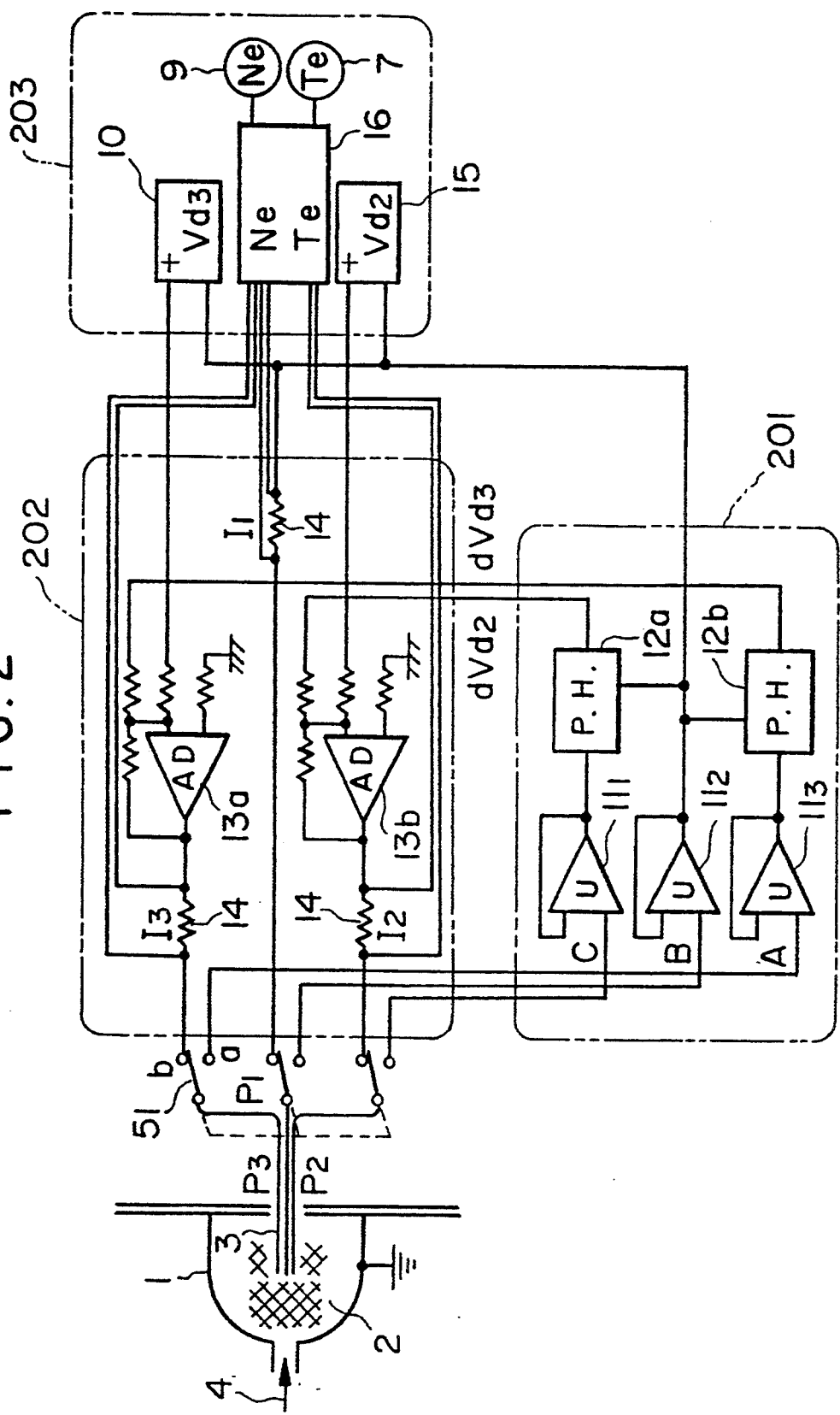
FIG. 2 is another system diagram showing another embodiment of the plasma measuring apparatus according to the present invention, in which its response speed is specially increased.

Further, in the circuit shown in FIG. 2, two fixed constant voltage power sources are used. Same as the circuit of FIG. 1, the space potential differences $dV_{d2}$ and $dV_{d3}$ between the adjacent probes in the off-condition are found, and the values as obtained are memorized. Subsequently, the switch 5 is changed-over to add the corrected voltage $dV_{d3}$ of the probe $P_3$ to the fixed constant voltage power source $V_{d3}$ by the addition circuit 202, followed by imparting it to the probe $P_3$, while the corrected voltage $dV_2$ of the probe $P_2$ is added to the fixed constant voltage power source $V_{d2}$, followed by imparting it to the probe $P_2$ for the measurement. The voltage drop of the current flowing in and through each probe at both ends of the low impedance resistor is introduced into the measuring circuit 103 to output the electron temperature Te and the electron density Ne onto the indicating instrument.

FIG. 1 is a system diagram showing one embodiment of the present invention, in which use is made of a single fixed constant voltage power source. A specimen gas is caused to flow into a plasma chamber 1 made of a metal material, and a micro-wave power is supplied from an inlet port 4, whereby a plasma 2 fills the interior of the plasma chamber 1. In this plasma 2, there are inserted three adjacently arranged probes ($P_1$, $P_2$, $P_3$) which are first connected to the space potential difference detecting and holding circuit 101 at the side "a" by means of the change-over switch 5.

The space potential difference detecting and holding circuit 101 includes high input impedance coupling amplifiers 11a, 11b, and 11c, each of which functions to generate a value of the potential, unloaded by circuit 102, of each probe under the particular plasma condition. The potential difference holding circuits 12a and 12b generate and hold, the potential difference $dV_{d2}$ between the probes $P_2$ and $P_1$, and the potential difference $dV_{d3}$ between the probes $P_3$ and $P_1$.

Next, when the change-over switch 5 is turned to the voltage adding circuit 102 at the side "b", the probe output reaches the measuring circuit 103 by way of the voltage adding circuit 102. This adding circuit 102 is constructed with a single high input impedance coupling amplifier lid and two addition amplifiers 13a and 13b. The measuring circuit 103 comprises an electron temperature measuring circuit 6, its indicating instrument 7, an electron density measuring circuit 8, its indicating instrument 9, and a fixed voltage power source 10. The fixed voltage power source $V_{d3}$ is usually at 10 volts. The potential difference voltage $dV_{d3}$ of the probe $P_3$ is added to, and corrected at, the addition amplifier 13a. The measured potential value of the probe $P_2$ is changed to a low impedance voltage by the high input impedance coupling amplifier 11d, then the potential difference $dV_{d2}$ of the probe $P_2$ is added to, and corrected at, the addition amplifier 13b, and the value is forwarded to the electron temperature measuring circuit 6, an output of which is indicated on the indicating instrument 7.

The low impedance resistor 14 has a resistance of approximately one ohm, in and through which the current $I=I_1=I_3$ shown in FIG. 6 flows. A voltage drop by this resistor and a measured value of the electron temperature Te are imparted to the electron density (Ne) measuring circuit 8, and the electron density Ne is indicated on the indicating instrument 9.

FIG. 2 illustrates a circuit diagram showing another embodiment of the plasma measuring apparatus according to the present invention. First of all, the switch 51 is turned to the side "a", whereby the potential difference $dV_{d2}$ between the probes $P_2$ and $P_1$ and the potential difference $dV_{d3}$ between the probes $P_3$ and $P_1$ are obtained as the outputs of the potential difference holding circuits 12a and 12b, same as in FIG. 1. In this case, there is provided in the measuring circuit 203 a fixed voltage power source 10 and another fixed voltage power source 15 at 2 volts. When the switch 51 is changed over to the side "b", a corrected voltage $dV_{d3}$ is added to a constant voltage $V_{d3}$ by the addition amplifier 13a in the addition circuit 202, thereafter it is imparted to the probe $P_3$. On the other hand, a corrected voltage $dV_{d2}$ is added to a constant voltage $V_{d2}$ by the addition amplifier 13b, thereafter it is imparted to the probe $P_2$. By imparting these corrected voltages, each of the probe currents $I_1$, $I_2$, and $I_3$, as corrected, flows in and through the low impedance resistor 14. The voltage drop of these currents is introduced into the measuring circuit 16, whereby the calculated value of the electron temperature Te is indicated on the indicating instrument 7, while the calculated value of the electron density Ne is indicated on the indicating instrument 9.

Comparing the circuits shown in FIGS. 1 and 2, it will be observed that the latter circuit, although its construction is somewhat complicated, is advantageously quick in its response speed, because a load on the probes is low.

When a micro-wave power of 2.45 GHz at 100 W was imparted to argon (Ar) gas at 0.08 Torr by means of the triple-probe plasma measuring apparatus of a preferred embodiment of the present invention with the space potential error having been corrected, it was found that the electron temperature Te was 2.1 eV and the electron density Ne was $1.6 \times 10^{10}$ cm$^{-3}$. When these values were compared with the values obtained by the single probe method, they were well within the errors of 10%. Further, when the measurements were conducted under the same conditions as mentioned above by the ordinary triple-probe method having no correcting circuit, it was found that the electron temperature Te was 2.7 eV and the electron density Ne was $2.3 \times 10^{10}$ cm$^{-3}$, which revealed the remarkable corrective effect by the triple-probe plasma measuring apparatus according to the present invention, in which the space potential errors are corrected.

Although the present invention has been described in detail in the foregoing with reference to the specific embodiments thereof, it should be noted that these embodiments are merely illustrative of the invention, and not so restrictive, and that any changes and modifications may be made by those persons skilled in the art, without departing from the spirit and scope of the present invention as recited in the appended claims.

What is claimed is:

1. A plasma measuring apparatus for coupling to three probes to measure an electron temperature and an electron density of a plasma, the apparatus comprising:
    a first circuit for measuring a voltage of one of the three probes and a current through another one of the three probes;
    a second circuit for detecting and holding a floating potential difference between two of the three probes, and for generating a first signal representing the floating potential difference;
    a fixed voltage source;
    a voltage adding circuit having a first input coupled to the first signal, a second input coupled to the fixed voltage source, and an output for generating a second signal representing a sum of the first and second inputs; and
    a switch for selectively coupling one of the three probes to the second signal.

2. A method of operating a plasma measuring apparatus having three probes, each probe having a probe terminal, the method comprising the steps of:
    immersing at least a portion of each of the plurality of probes into a plasma;
    coupling a first one of the probe terminals to a first circuit having a first impedance while measuring a voltage of the first one of the probe terminals to produce a first measured voltage; and
    subsequently, coupling the first one of the probe terminals to a voltage source having an impedance lower than the first impedance while measuring a voltage of a second one of the probe terminals to produce a second measured voltage and measuring a voltage of a third one of the probe terminals to produce a third measured voltage.

3. The method of claim 2, further including the step of:
    setting a value of the voltage source in accordance with the first measured voltage.

4. A plasma measuring apparatus comprising:
    three probes, each probe having a probe terminal;
    a first circuit having a first impedance;
    a voltage source having an impedance lower than the first impedance;
    means for coupling a first one of the probe terminals to the first circuit and measuring a voltage of the first one of the probe terminals to produce a first measured voltage; and
    means for coupling the first one of the probe terminals to the voltage source and measuring a voltage of a second one of the probe terminals to produce a second measured voltage and measuring a voltage of a third one of the probe terminals to produce a third measured voltage.

5. The plasma measuring apparatus of claim 4, further including:
    means for setting a value of the voltage source in accordance with the first measured voltage.

* * * * *